(12) United States Patent
Sun et al.

(10) Patent No.: US 10,185,863 B2
(45) Date of Patent: Jan. 22, 2019

(54) ULTRASONIC TRANSDUCER, METHOD FOR MANUFACTURING ULTRASONIC TRANSDUCER, ULTRASONIC FINGER RECOGNITION SENSOR AND ELECTRONIC DEVICE

(71) Applicant: NANCHANG O-FILM BIO-IDENTIFICATION TECHNOLOGY CO., LTD., Nanchang (CN)

(72) Inventors: Wensi Sun, Nanchang (CN); Anpeng Bai, Nanchang (CN)

(73) Assignee: NANCHANG O-FILM BIO-IDENTIFICATION TECHNOLOGY CO., LTD., Nanchang (CN)

( * ) Notice: Subject to any disclaimer, the term of this patent is extended or adjusted under 35 U.S.C. 154(b) by 24 days.

(21) Appl. No.: 15/490,978

(22) Filed: Apr. 19, 2017

(65) Prior Publication Data
US 2018/0068154 A1    Mar. 8, 2018

(30) Foreign Application Priority Data

Sep. 5, 2016   (CN) .......................... 2016 1 0802396

(51) Int. Cl.
*G06K 9/00* (2006.01)
*B06B 1/06* (2006.01)
(Continued)

(52) U.S. Cl.
CPC .......... *G06K 9/0002* (2013.01); *B06B 1/0629* (2013.01); *G06K 9/00053* (2013.01);
(Continued)

(58) Field of Classification Search
CPC ............ G06K 9/0002; G06K 9/000503; H01L 41/29; H01L 41/1876; H01L 41/0825; H01L 41/0477; B06B 1/0629
See application file for complete search history.

(56) References Cited

U.S. PATENT DOCUMENTS

5,818,149 A * 10/1998 Safari ..................... H01L 41/37
                                                              310/358
8,692,441 B2 * 4/2014 Dausch ................. B06B 1/0607
                                                              216/56
(Continued)

*Primary Examiner* — John B Strege
(74) *Attorney, Agent, or Firm* — Hodgson Russ LLP (57) ABSTRACT

The present disclosure discloses an ultrasonic transducer. The ultrasonic transducer includes a piezoelectric layer. The piezoelectric layer includes an array of piezoelectric posts, a plurality of emitting electrodes, and a plurality of receiving electrodes. The piezoelectric posts are configured for emitting and receiving ultrasonic wave. The material of each of the piezoelectric posts includes lead zirconate titanate piezoelectric ceramics. The emitting electrodes are formed on a lower surface of the piezoelectric layer by a sputtering process. The receiving electrodes are formed on an upper surface of the piezoelectric layer by the sputtering process. Each of the emitting electrodes and each of the receiving electrodes include lead, zirconium, titanium, and/or alloys thereof. The present disclosure also discloses a method for manufacturing the ultrasonic transducer, an ultrasonic fingerprint recognition sensor having the ultrasonic transducer, and an electronic device having the ultrasonic fingerprint recognition sensor.

16 Claims, 9 Drawing Sheets

(51) Int. Cl.
*H01L 41/047* (2006.01)
*H01L 41/08* (2006.01)
*H01L 41/187* (2006.01)
*H01L 41/29* (2013.01)

(52) U.S. Cl.
CPC ...... *H01L 41/0477* (2013.01); *H01L 41/0825* (2013.01); *H01L 41/1876* (2013.01); *H01L 41/29* (2013.01)

(56) References Cited

U.S. PATENT DOCUMENTS

| | | | |
|---|---|---|---|
| 9,211,980 B1* | 12/2015 | Gruenbacher | A61L 9/14 |
| 9,613,246 B1* | 4/2017 | Gozzini | G06K 9/0002 |
| 9,953,205 B1* | 4/2018 | Rasmussen | G06K 9/0002 |
| 2005/0156491 A1* | 7/2005 | Scott | B06B 1/064 |
| | | | 310/334 |
| 2006/0121200 A1* | 6/2006 | Halpert | C04B 41/009 |
| | | | 427/305 |
| 2014/0292941 A1* | 10/2014 | Kobayashi | B06B 1/0629 |
| | | | 347/68 |
| 2014/0354596 A1* | 12/2014 | Djordjev | G06K 9/0002 |
| | | | 345/175 |
| 2015/0357375 A1* | 12/2015 | Tsai | H01L 27/20 |
| | | | 257/416 |
| 2015/0380636 A1* | 12/2015 | Fujisawa | C08K 3/22 |
| | | | 524/783 |
| 2017/0262684 A1* | 9/2017 | Lee | G06K 9/0002 |
| 2017/0344778 A1* | 11/2017 | Lee | G06K 9/0002 |

* cited by examiner

```
Impinging a target with predetermined ions so that the
component on a surface of the target is sputtered out of     S201
the target in the form of atoms or ions
```

```
Depositing the atoms or the ions on the lower surface        S202
and the upper surface of the piezoelectric layer to form
the emitting electrodes and the receiving electrodes
```

ULTRASONIC TRANSDUCER, METHOD FOR MANUFACTURING ULTRASONIC TRANSDUCER, ULTRASONIC FINGER RECOGNITION SENSOR AND ELECTRONIC DEVICE

CROSS-REFERENCE TO RELATED APPLICATION

This application claims priority to and benefits of Chinese Patent Application Serial No. 201610802396.0, filed with the State Intellectual Property Office of P. R. China on Sep. 5, 2016, the entire contents of which are incorporated herein by reference.

FIELD

The present disclosure relates to ultrasonic fingerprint recognition technologies and, particularly, to an ultrasonic transducer, a method for manufacturing the ultrasonic transducer, an ultrasonic fingerprint recognition sensor having the ultrasonic transducer, and an electronic device having the ultrasonic fingerprint recognition sensor.

BACKGROUND

An ultrasonic transducer includes an array of piezoelectric posts, emitting electrodes, and receiving electrodes. Each of the piezoelectric posts corresponds to an emitting electrode and a receiving electrode. When in operation, a voltage is applied to the piezoelectric posts via the emitting electrodes and the receiving electrodes, the piezoelectric posts emit ultrasonic wave to an object, and the piezoelectric posts receive the ultrasonic wave reflected by the object, the contour of the object, i.e., the fingerprint of a finger, applied to the ultrasonic transducer can be detected. However, because of the material and process of the ultrasonic transducer, the thicknesses of the emitting electrodes corresponding to different piezoelectric posts may be different, and the thicknesses of the receiving electrodes corresponding to different piezoelectric posts may be different, which results in the emitted ultrasonic wave being uneven, and the received ultrasonic wave being uneven. Thus, the detection accuracy of the ultrasonic transducer is decreased.

SUMMARY

The present disclosure aims to solve at least one of the problems existing in the prior art to some extent at least.

An ultrasonic transducer of an embodiment of the present disclosure includes a piezoelectric layer. The piezoelectric layer includes an array of piezoelectric posts, a plurality of emitting electrodes, and a plurality of receiving electrodes. The piezoelectric posts are configured for emitting and receiving ultrasonic waves. The material of each of the piezoelectric posts includes lead zirconate titanate piezoelectric ceramics. The emitting electrodes are formed on a lower surface of the piezoelectric layer by a sputtering process. The receiving electrodes are formed on an upper surface of the piezoelectric layer by the sputtering process. Each of the emitting electrodes and each of the receiving electrodes include lead, zirconium, titanium, and/or alloys thereof.

In some embodiments, the piezoelectric posts are arranged in a matrix.

In some embodiments, the ultrasonic transducer further includes a plurality of emitting electrode lines and a plurality of receiving electrode lines. The emitting electrode lines are formed on the lower surface of the piezoelectric layer. Each of the emitting electrode lines is connected to a row of the piezoelectric posts. The receiving electrode lines are formed on the upper surface of the piezoelectric layer. Each of the receiving electrode lines is connected to a column of the piezoelectric posts.

In some embodiments, the emitting electrodes and the receiving electrodes are made of titanium-silicon alloy, titanium-zinc alloy, or titanium-nickel alloy.

In some embodiments, the ultrasonic transducer further includes a lower protective layer and an upper protective layer. The lower protective layer is arranged on lower ends of the emitting electrodes. The upper protective layer is arranged on the upper ends of the receiving electrodes.

In some embodiments, the piezoelectric layer further includes a filling portion. The filling portion is filled with gaps between the piezoelectric posts.

In some embodiments, the cross-section of each of the piezoelectric posts is substantially square.

In some embodiments, the height of each of the piezoelectric posts is about 70-80 micrometers.

In some embodiments, the filling portion is made of epoxy resin.

In some embodiments, the array of piezoelectric posts are formed by cutting groove grids on the piezoelectric material from a first direction and a second direction in a predetermined depth, and the first direction is perpendicular to the second direction.

In some embodiments, the array of piezoelectric posts are formed by etching a filling material at a predetermined position to form a plurality of columnar through holes, and then filling piezoelectric material in the columnar through holes.

A method for manufacturing an ultrasonic transducer of an embodiment of the present disclosure, including:

forming a piezoelectric layer, the piezoelectric layer comprising a plurality of piezoelectric posts, the material of each of the piezoelectric posts comprising lead zirconate titanate piezoelectric ceramics; and sputtering emitting electrodes on a lower surface of the piezoelectric layer and sputtering receiving electrodes on an upper surface of the piezoelectric layer, and each of the emitting electrodes and each of the receiving electrodes comprise lead, zirconium, titanium, and/or alloys thereof.

In some embodiments, the step of sputtering process includes:

impinging a target with predetermined ions so that the component on a surface of the target is sputtered out of the target in the form of atoms or ions; and depositing the atoms or the ions on the lower surface and the upper surface of the piezoelectric layer to form the emitting electrodes and the receiving electrodes.

In some embodiments, the target includes a lead target, a zirconium target, or a titanium target.

In some embodiments, the target includes a titanium silicon target, a titanium zinc target, or a titanium nickel target.

In some embodiments, the method further includes:

forming a lower protective layer on lower ends of the emitting electrodes; and forming an upper protective layer on upper ends of the receiving electrodes.

In some embodiments, the step of forming a piezoelectric layer includes:

cutting groove grids on the piezoelectric material from a first direction and a second direction in a predetermined depth, and the first direction is perpendicular to the second direction.

In some embodiments, the step of forming a piezoelectric layer includes:

etching a filling material at a predetermined position to form a plurality of columnar through holes; and filling piezoelectric material in the columnar through holes.

An ultrasonic fingerprint recognition sensor of an embodiment of the present disclosure includes a substrate, a control chip positioned on and electrically connected to the substrate, an ultrasonic transducer positioned on and electrically connected to the control chip, and a package packing the substrate, the control chip, and the ultrasonic transducer as a module. The ultrasonic transducer includes a piezoelectric layer. The piezoelectric layer includes an array of piezoelectric posts, a plurality of emitting electrodes, and a plurality of receiving electrodes. The piezoelectric posts are configured for emitting and receiving ultrasonic wave. The material of each of the piezoelectric posts includes lead zirconate titanate piezoelectric ceramics. The emitting electrodes are formed on a lower surface of the piezoelectric layer by a sputtering process. The receiving electrodes are formed on an upper surface of the piezoelectric layer by the sputtering process. Each of the emitting electrodes and each of the receiving electrodes include lead, zirconium, titanium, and/or alloys thereof.

An electronic device of an embodiment of the present disclosure includes a casing and an ultrasonic fingerprint recognition sensor positioned in the casing for fingerprint recognition or authorization. The ultrasonic fingerprint recognition sensor includes a substrate, a control chip positioned on and electrically connected to the substrate, an ultrasonic transducer positioned on and electrically connected to the control chip, and a package packing the substrate, the control chip, and the ultrasonic transducer as a module. The ultrasonic transducer includes a piezoelectric layer. The piezoelectric layer includes an array of piezoelectric posts, a plurality of emitting electrodes, and a plurality of receiving electrodes. The piezoelectric posts are configured for emitting and receiving ultrasonic wave. The material of each of the piezoelectric posts includes lead zirconate titanate piezoelectric ceramics. The emitting electrodes are formed on a lower surface of the piezoelectric layer by a sputtering process. The receiving electrodes are formed on an upper surface of the piezoelectric layer by the sputtering process. Each of the emitting electrodes and each of the receiving electrodes include lead, zirconium, titanium, and/or alloys thereof.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions.

The embodiments described herein with reference to the accompanying drawings are explanatory and illustrative, which are used to generally understand the present disclosure. The embodiments shall not be construed to limit the present disclosure.

Figure 1:
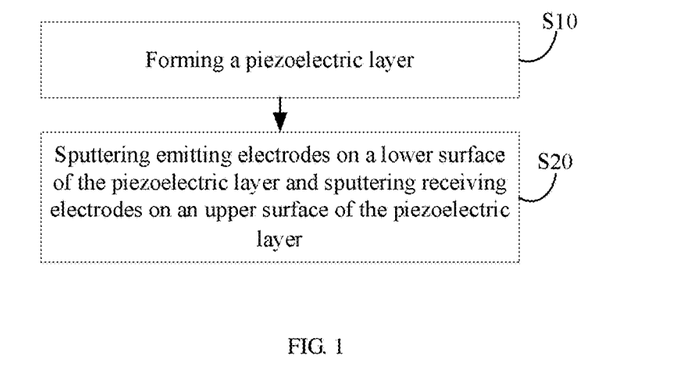
FIG. 1 is a flow chart of a method for manufacturing an ultrasonic transducer, according to an embodiment of the present disclosure.
Figure 2:
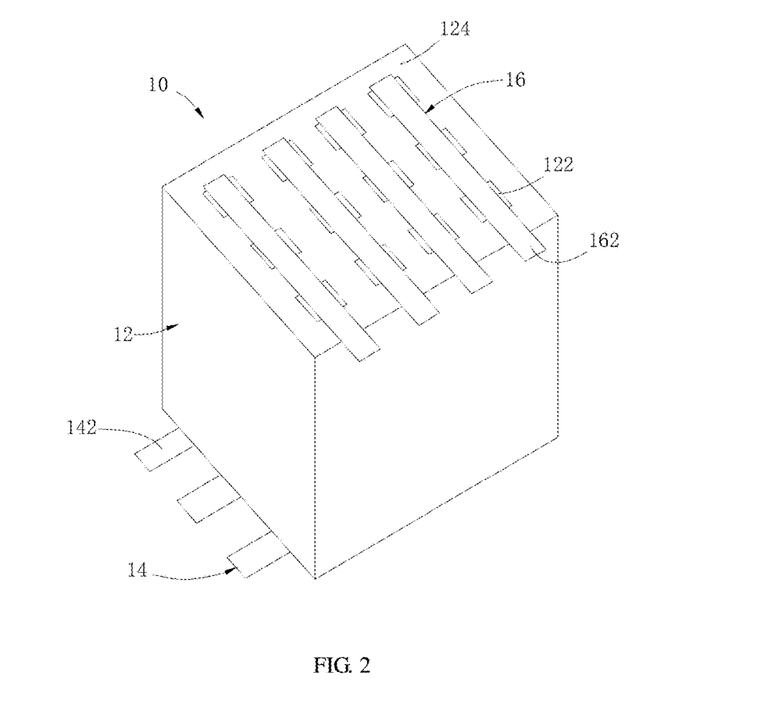
FIG. 2 is an isometric view of an ultrasonic transducer, according to an embodiment of the present disclosure.

Referring to FIGS. 1-2, a method for manufacturing an ultrasonic transducer 10, according to an embodiment of the present disclosure, includes the following steps of:

S10: forming a piezoelectric layer 12. The piezoelectric layer 12 includes a plurality of piezoelectric posts 122. The material of each of the piezoelectric posts 122 includes lead zirconate titanate piezoelectric ceramics.

S20: sputtering emitting electrodes 14 on a lower surface of the piezoelectric layer 12 and sputtering receiving electrodes 16 on an upper surface of the piezoelectric layer 12. Each of the emitting electrodes 14 and each of the receiving electrodes 16 include lead, zirconium, titanium, and/or alloys thereof.

Figure 3:
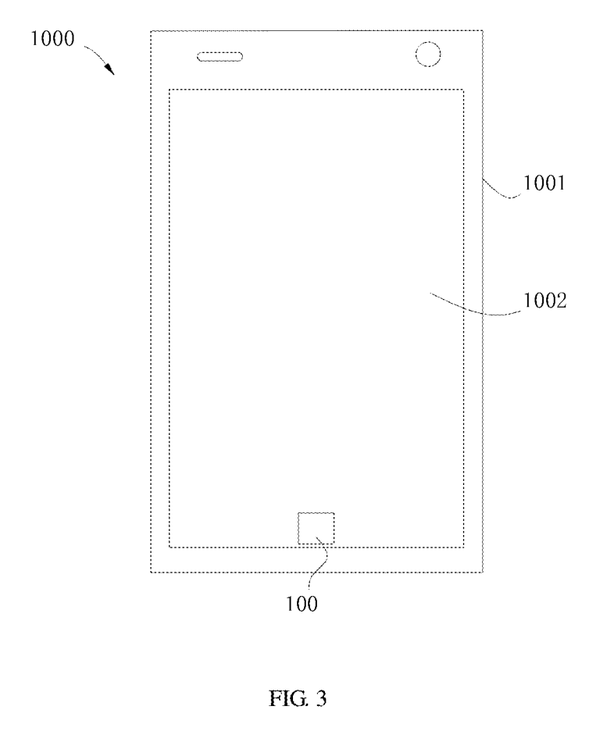
FIG. 3 is a planar view of an ultrasonic fingerprint recognition sensor, according to an embodiment of the present disclosure.

Referring to FIGS. 2-3, an ultrasonic transducer 10 used in an ultrasonic fingerprint recognition sensor 100, according to an embodiment of the present disclosure, includes a piezoelectric layer 12, a plurality of emitting electrodes 14, and a plurality of receiving electrodes 16. The piezoelectric layer 12 includes a plurality of piezoelectric posts 122. The material of each of the piezoelectric posts 122 includes lead zirconate titanate piezoelectric ceramics. The emitting electrodes 14 are formed on a lower surface of the piezoelectric layer 12 by a sputtering process, and the receiving electrodes 16 are formed on an upper surface of the piezoelectric layer 12 by the sputtering process. Each of the emitting electrodes 14 and each of the receiving electrodes 16 include lead, zirconium, titanium, and/or alloys thereof.

The method of the embodiment of the present disclosure can be used to manufacture the ultrasonic transducer 10 of the embodiment of the present disclosure.

In the embodiment of the present disclosure, the piezoelectric layer 12 also includes a filling portion 124. The filling portion 124 is filled with gaps between the piezoelectric posts 122. The ultrasonic transducer 10 can be embedded in the ultrasonic fingerprint recognition sensor 100. The ultrasonic fingerprint recognition sensor 100 can be used in an electronic device 1000, such as a smartphone, a laptop, a tablet, a TV, or a PAD.

Figure 14:
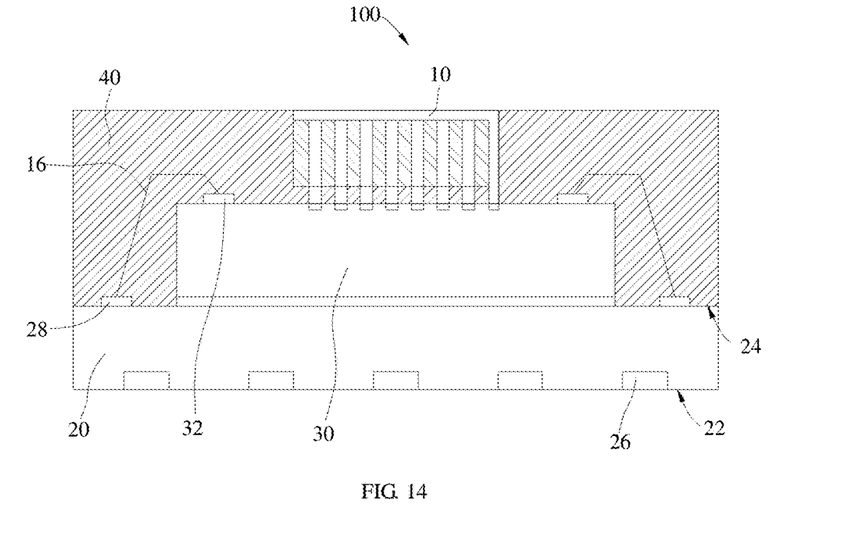
FIG. 14 is a cross-sectional schematic view of an ultrasonic fingerprint recognition sensor, according to an embodiment of the present disclosure.

Referring to FIG. 14, an ultrasonic fingerprint recognition sensor 100, according to an embodiment of the present disclosure, includes the ultrasonic transducer 10.

In some embodiments, in addition to the ultrasonic transducer 10, the ultrasonic fingerprint recognition sensor 100 further includes a substrate 20, a control chip 30, and a package 40.

The substrate 20 includes a first surface 22, a second surface 24 opposite to the first surface 22, a plurality of first electrodes 26 formed on the first surface 22, and a plurality of second electrodes 28 formed on a periphery of the second surface 24 and electrically connected with the first electrodes 26 in a desired manner.

The control chip 30 is positioned on the substrate 20, e.g., the second surface 24, via, e.g., an adhesive. The control chip 30 includes a plurality of third electrodes 32 formed on a surface opposite to the substrate 20. The third electrodes 32 can be connected to the second electrodes 28 in a desired manner via, e.g., a wire bonding technology.

The ultrasonic transducer 10 is positioned on and electrically connected to the control chip 30. The package 40 packages and fixes the ultrasonic transducer 10, the control chip 30, and the substrate 20 together.

As such, the ultrasonic transducer 10, the control chip 30, and the substrate 20 can work as a module with a substantially complete function. For example, the substrate 20 facilitates connection with external circuits, and receives and sends signal to the control chip 30. The control chip 30 controls the ultrasonic transducer 10 to emit and detect the ultrasonic wave and process the signal from the ultrasonic transducer 10 to recognize the fingerprint.

Referring to FIG. 3, an electronic device 1000, such as a smartphone, a laptop, a tablet, a TV, or a PAD, according to an embodiment of the present disclosure, includes the ultrasonic fingerprint recognition sensor 100.

In this embodiment, the electronic device 1000 is a smartphone. In addition to the ultrasonic fingerprint recognition sensor 100, the electronic device 1000 further includes a housing 1001 and a display 1002 fixed to a front surface of the housing 1001. The ultrasonic fingerprint recognition sensor 100 can be positioned in the housing 1001, e.g., beneath the display 1002, for fingerprint recognition or authorization.

In the ultrasonic transducer 10, the method for manufacturing the ultrasonic transducer 10, the ultrasonic fingerprint recognition sensor 100, and the electronic device 100, according to the embodiments of the present disclosure, since the emitting electrodes 14 and the receiving electrodes 16 are formed on the piezoelectric layer 12 by a sputtering process, and the lattice matching degrees between the material of the piezoelectric posts 122 and the material of the emitting electrodes 14, and between the material of the piezoelectric posts 122 and the material of the receiving electrodes 16 are higher, the thicknesses of the emitting electrodes 14 corresponding to different piezoelectric posts 122 are the same, and the thicknesses of the receiving electrodes 16 corresponding to the different piezoelectric posts 122 are the same, which results that the impedances of the emitting electrodes 14 are even, and the impedances of the receiving electrodes 16 are even. Thus, the detection accuracy of the ultrasonic transducer is increased.

Figure 4:
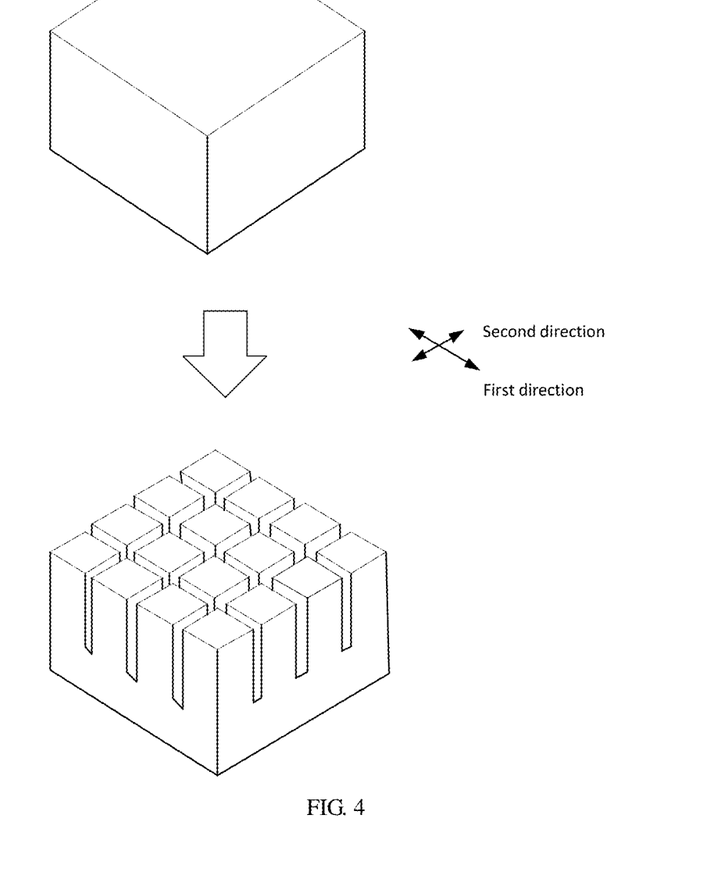
FIG. 4 is a schematic view showing a manufacturing process of a piezoelectric layer, according to an embodiment of the present disclosure.

Referring to FIG. 4, in one embodiment, the step of S10 can be achieved by cutting a block of piezoelectric material, i.e., blocky square piezoelectric material. The piezoelectric material is lead zirconate titanate piezoelectric ceramics. In detail, a cutting device (not shown) having a certain width, cuts groove grids on the piezoelectric material from a first direction and a second direction in a predetermined depth, thereby forming the plurality of piezoelectric posts 122. In some embodiments, the first direction is perpendicular to the second direction. The predetermined depth is equal to the height of each of the piezoelectric posts 122. The width of the cutting device is equal to the gap width between the piezoelectric posts 122. The height of the piezoelectric post 122 and the gap width between the piezoelectric posts 122 can be designed according to the actual design requirements and the actual process requirements. In addition, filling material, i.e., epoxy resin, is filled with the gaps between the piezoelectric posts 122 to form the filling portion 124. The filling portion 124 stabilizes the structure of the piezoelectric layer 12, and the position of the piezoelectric posts 122 cannot shift left or right. Thus, the piezoelectric posts 122 are formed.

Figure 5:
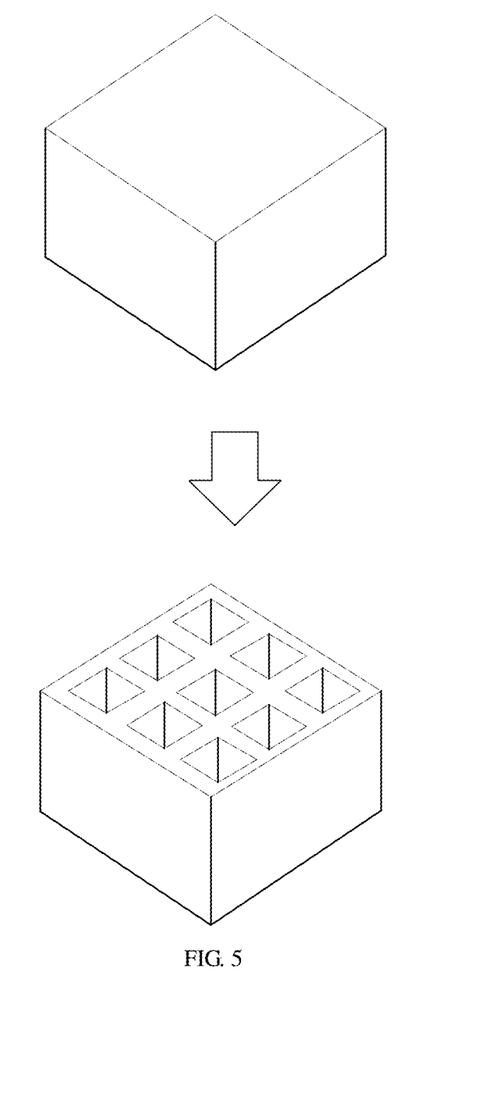
FIG. 5 is another schematic view showing a manufacturing process of a piezoelectric layer, according to an embodiment of the present disclosure.

Referring to FIG. 5, in one embodiment, the step of S10 can be achieved by means that a plurality of columnar through holes are formed by etching at a predetermined position on a filling material, such as epoxy resin, and then piezoelectric material, working as piezoelectric posts 122, is filled in the columnar through holes. The rest of the filling material after etching works as the filling portion 124. Thus, the piezoelectric posts 122 are formed.

In some embodiments, the gap width between the piezoelectric posts 122 can be about 50 micrometers. Since the gap width between the piezoelectric posts 122 is about 50 micrometers, the resolution of the sample captured by the ultrasonic transducer 10 can be satisfied, for example, the resolution of the sample captured by the ultrasonic transducer 10 is greater than 508 DPI (Dots per Inch, the number of points printed per inch). If the gap width between the piezoelectric posts 122 is greater than 50 micrometers, the resolution of the sample will be decreased, and the emitted and received ultrasonic wave will become weaker. Thus, the fingerprint cannot be identified accurately. In some embodiments, the piezoelectric posts 122 are arranged in a matrix. Since the plurality of piezoelectric posts 122 are arranged in a regular manner, the piezoelectric posts 122 are easily manufactured, and electrode lines are easily formed on the upper surface and/or the lower surface of each of the piezoelectric posts 122.

In some embodiments, the height of each of the piezoelectric posts 122 is about 70-80 micrometers. The cross-section of each of the piezoelectric posts 122 is substantially square, and the width of the cross-section is about 30 micrometers. Thus, the resolution of the sample captured by the ultrasonic transducer 10 can be satisfied, for example, the resolution of the sample captured by the ultrasonic transducer 10 is greater than 508 DPI. It is understood that the shapes of the piezoelectric posts 122 can be different; the sizes of the piezoelectric posts 122 can also be different.

Figure 6:
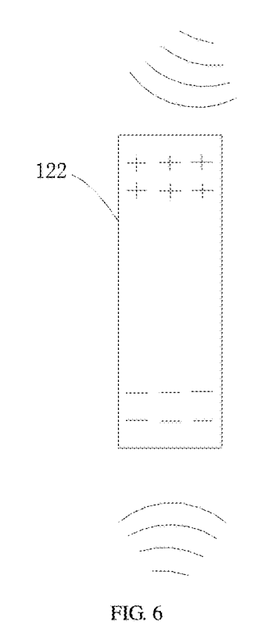
FIG. 6 is a schematic view showing that piezoelectric posts of the ultrasonic transducer emit ultrasonic wave, according to an embodiment of the present disclosure.

The piezoelectric posts 122 emit the ultrasonic wave using the inverse piezoelectric effect of the piezoelectric material, and receive the ultrasonic wave using the positive piezoelectric effect of the piezoelectric material. The positive piezoelectric effect is that: when a force is applied to the piezoelectric material, the piezoelectric material will produce phenomenon of polarization, and positive and negative charges will be formed on opposite surfaces of the piezoelectric material; when the force is removed, the piezoelectric material is restored to an uncharged state. Referring to FIG. 6, the piezoelectric posts 122 are deformed by the force of the ultrasonic wave, and produce a potential difference between the opposite surfaces of each of the piezoelectric posts 122. The potential difference can be showed in the form of an image by an amplifier and an analog-to-digital converter.

The potential difference is that: when an alternating electric voltage is applied to the piezoelectric material, the piezoelectric material will be mechanically deformed.

Figure 7:
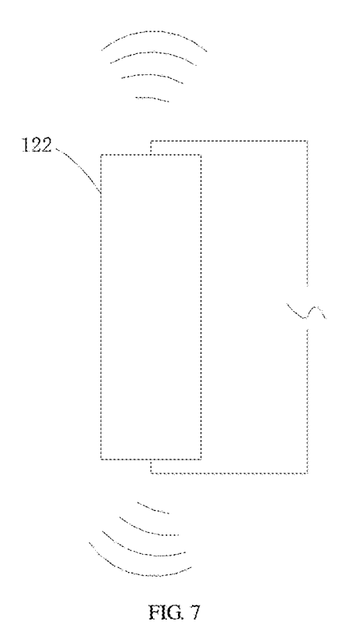
FIG. 7 is a schematic view showing the piezoelectric posts of the ultrasonic transducer receive ultrasonic wave, according to an embodiment of the present disclosure.

Referring to FIG. 7, the piezoelectric posts 122 generate mechanical vibration by receiving the alternating electric voltage. The frequency of the mechanical vibration is controlled by adjusting the oscillation frequency of the alternating voltage, thereby causing the piezoelectric posts 122 to emit ultrasonic waves.

Referring to FIG. 2, in some embodiments, the piezoelectric posts 122 typically run through the piezoelectric layer 12 along the height direction of the piezoelectric layer 12. The ultrasonic transducer 10 further includes a plurality of emitting electrode lines 142 formed on a lower surface of the piezoelectric layer 12. Each of the emitting electrode lines 142 is connected to a row of the piezoelectric posts 122.

The ultrasonic transducer 10 further includes a plurality of receiving electrode lines 162 formed on an upper surface of the piezoelectric layer 12. Each of the receiving electrode lines 162 is connected to a column of the piezoelectric posts 122.

As such, when the ultrasonic wave is emitted, all of the receiving electrode lines 162 are grounded, and an alternating electric voltage is applied to the emitting electrode lines 142, the piezoelectric posts 122 generate mechanical vibration and produce the ultrasonic wave. When the ultrasonic wave is received, all of the emitting electrode lines 142 are grounded; the piezoelectric posts 122 are deformed by the force of the ultrasonic wave, and produce a potential difference between the opposite surfaces of each of the piezoelectric posts 122. The receiving electrode lines 162 receive the potential difference.

In this embodiment, all the widths of each of the emitting electrode lines 142 are equal, and all the widths of each of the receiving electrode lines 162 are equal.

In this way, the emitting electrode lines 142 and the receiving electrode lines 162 are uniform in size and easy to manufacture, thereby saving the manufacturing cost of the ultrasonic transducer 10.

In use, when the ultrasonic wave is emitted, the voltages with different intensities applied to the piezoelectric posts 122 cause the piezoelectric posts 122 to emit the ultrasonic waves having different intensities. Even if the piezoelectric posts 122 are arranged in the same row, the voltages received by the piezoelectric posts 122 have different intensities, as the lengths of the emitting electrode lines 142 between the power source and the different piezoelectric posts 122 are different.

Figure 8:
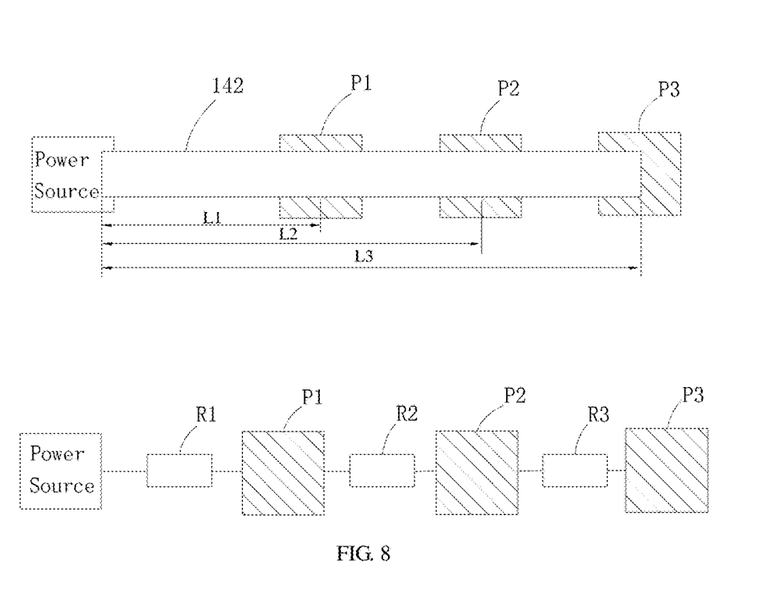
FIG. 8 is a schematic view showing the piezoelectric posts of the ultrasonic transducer is connected to emitting electrode lines.

In detail, referring to FIG. 8, as an example, the piezoelectric posts P1, P2, and P3 are continuously arranged in the same row and are connected to the same emitting electrode line 142.

Wherein, the length of the emitting electrode line 142 between the power source and the piezoelectric post P1 is represented as L1, the length of the emitting electrode line 142 between the power source and the piezoelectric post P2 is represented as L2, and the length of the emitting electrode line 142 between the power source and the piezoelectric post P3 is represented as L3.

Since the lengths (L1, L2, and L3) of the emitting electrode lines 142 between the power source and the different piezoelectric posts 122 are different, the potential values of the piezoelectric posts P1, P2, and P3 are different. If the impedances of the emitting electrode lines 142 are even, or the lengths of the emitting electrode lines 142 are even, the impedance R1 of the emitting electrode lines 142 between the power source and the piezoelectric post P1, the impedance R2 of the emitting electrode lines 142 between the power source and the piezoelectric post P2, and the impedance R3 of the emitting electrode lines 142 between the power source and the piezoelectric post P3 can be easily obtained by the relationship between the lengths L1, L2, and L3. Thus, the actual potential values of the piezoelectric posts P1, P2, and P3 and the actual ultrasonic wave emitted by the piezoelectric posts P1, P2, and P3 can be obtained.

Further, similar to those of the above-described piezoelectric posts 122, the potential values of the piezoelectric posts 122 arranged in different rows have differences.

Similarly, when the ultrasonic wave is received, if the impedances of the receiving electrode lines 162 are even, or the lengths of the receiving electrode lines 162 are even, the impedances of the receiving electrode lines 162 between the power source and the piezoelectric posts 122 can be easily obtained by the relationship among the lengths of the receiving electrode lines 162 between the power source and the different piezoelectric post 122 arranged in the same row. Thus, the actual ultrasonic wave received by the piezoelectric posts 122 can be obtained.

In view of the above discussion, in order to improve the detection accuracy of the ultrasonic fingerprint recognition device 100, each of the receiving electrode lines 162 needs to have uniform impedance, each of the emitting electrode lines 142 needs to have uniform impedance. In other words, each of the receiving electrode lines 162 needs to have a uniform thickness, each of the emitting electrode lines 142 needs to have a uniform thickness. That is, the thicknesses of the emitting electrodes 14 corresponding to the different piezoelectric posts 122 needs to be the same, and the thicknesses of the receiving electrodes 16 corresponding to the different piezoelectric posts 122 needs to be the same.

Figure 9:
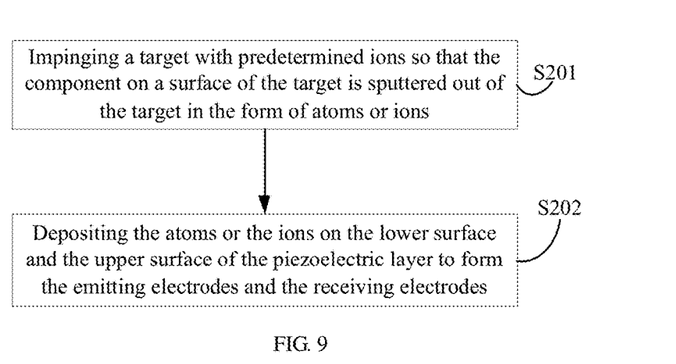
FIG. 9 is another flow chart of a method for manufacturing an ultrasonic transducer, according to an embodiment of the present disclosure.

Referring to FIG. 9, in some embodiments, the step of S20 includes the following sub-steps of:

S201: impinging a target with predetermined ions so that the component on a surface of the target is sputtered out of the target in the form of atoms or ions; and S202: depositing the atoms or the ions on the lower surface and the upper surface of the piezoelectric layer 12 to form the emitting electrodes 14 and the receiving electrodes 16.

As such, since the emitting electrodes 14 are formed on the lower surface of the piezoelectric layer 12 by a sputtering process, and the receiving electrodes 16 are formed on the upper surface of the piezoelectric layer 12 by the sputtering process, the adhesion between the emitting electrodes 14 and the piezoelectric layer 12 is better, the adhesion between the receiving electrodes 16 and the piezoelectric layer 12 is better, and the thicknesses of the emitting electrode 14 and the receiving electrode 16 are easily controlled.

Figure 10:
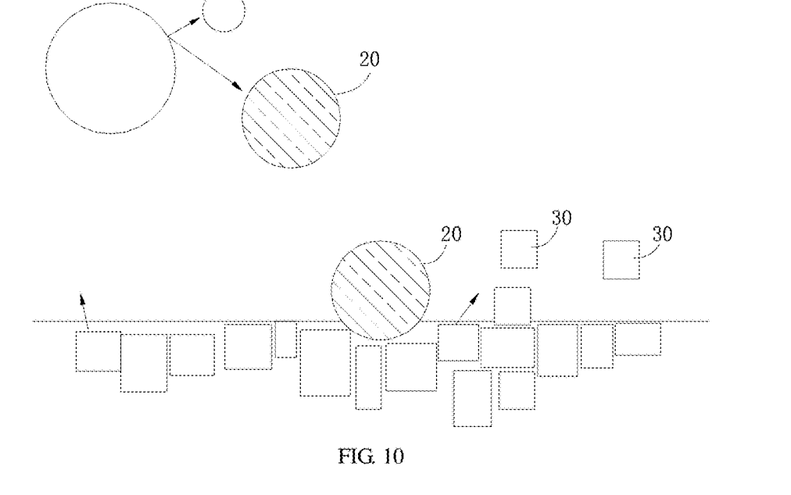
FIG. 10 is a schematic view showing atoms or ions are captured by a sputtering process, according to an embodiment of the present disclosure.

In detail, referring to FIG. 10, gas molecules, such as argon, are ionized to form positive ions 20 and electrons. The positive ions 20 accelerate under the action of an electric field and bombard the target after having a certain kinetic energy to increase the energy of the component on the surface of the target, so that the component on the surface of the target is sputtered out of the target in the form of atoms or ions.

And then, the atoms or the ions are deposited on the lower surface and the upper surface of the piezoelectric layer 12 to form the emitting electrodes 14 and the receiving electrodes 16. The areas of the lower surface of the piezoelectric layer 12, which do not have the emitting electrodes 14, are covered, thereby forming striped emitting electrode lines 142. Similarly, the areas of the upper surface of the piezoelectric layer 12, which do not have the receiving electrodes 16, are covered, thereby forming striped receiving electrode lines 162.

In operation, the steps of S201 and S202 can be executed in a sputtering machine. In particular, the parameters of the sputtering process, such as the temperature of the target, the time of sputtering, and the pressure, can be adjusted according to requirement.

In some embodiments, the thickness of each of the emitting electrodes 14 is about 2.5 micrometers, and the thickness of each of the receiving electrodes 16 is about 2.5 micrometers.

As such, the thickness of each of the emitting electrode lines 142 and the thickness of each of the receiving electrode lines 162 meet the process requirement, thereby ensuring a good electrical performance.

In some embodiments, when the electrical performance is satisfied, the thickness of each of the emitting electrode lines 142 can be different with the thickness of each of the receiving electrode lines 162.

In some embodiments, the target includes a lead target, a zirconium target, or a titanium target.

Thus, the emitting electrodes 14 and the receiving electrodes 16 formed by the sputtering process, in which the lead target, the zirconium target, or the titanium target is utilized, include lead, zirconium, or titanium.

In some embodiments, the target includes a titanium silicon target, a titanium zinc target, or a titanium nickel target.

Thus, the emitting electrodes 14 and the receiving electrodes 16 formed by the sputtering process, in which the titanium silicon target, the titanium zinc target, or the titanium nickel target is utilized, include titanium-silicon alloy, titanium-zinc alloy, or titanium-nickel alloy.

Thus, since the lattice matching degrees between the material of the piezoelectric posts 122 and the material of the emitting electrodes 14, and between the material of the piezoelectric posts 122 and the material of the receiving electrodes 16 are higher, the emitting electrodes 14 corresponding to different piezoelectric posts 122 have the same thickness, and the receiving electrodes 16 corresponding to different piezoelectric posts 122 have the same thickness, which results that the impedances of the emitting electrodes 14 are even, and the impedances of the receiving electrodes 16 are even. Thus, the detection accuracy of the ultrasonic transducer is increased.

The piezoelectric posts 122 is made of lead zirconate titanate piezoelectric ceramics by sintering zirconium dioxide, lead zirconate, and lead titanate at about 1200 degrees Celsius.

Figure 11:
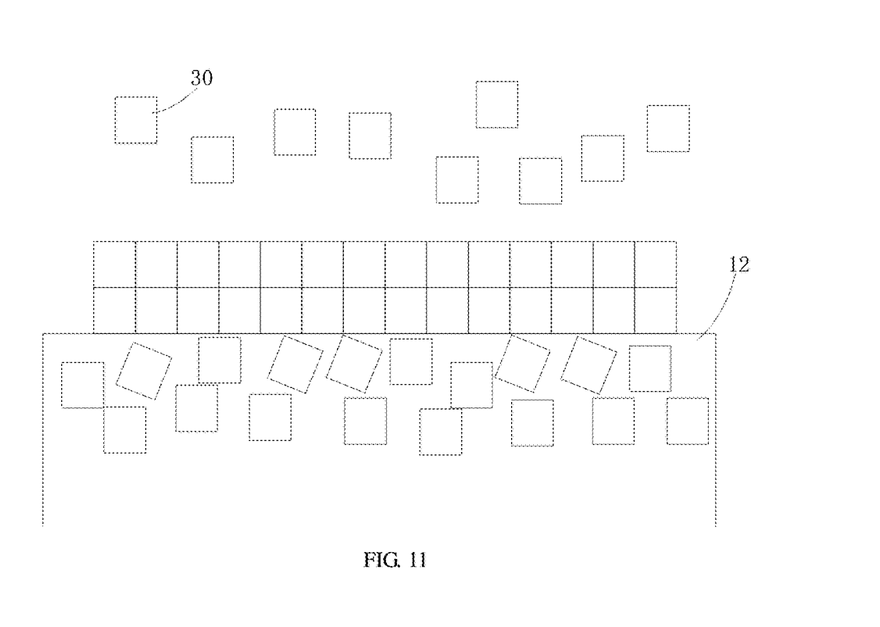
FIG. 11 is a schematic view showing receiving electrodes of the ultrasonic transducer are obtained by a deposition process, according to an embodiment of the present disclosure.

In detail, referring to FIG. 11, take depositing the receiving electrodes 16 as an example, during depositing the atoms or the ions 30 on the upper surface of the piezoelectric layer 12, the atoms or the ions 30 are deposited on the piezoelectric layer 12 layer by layer. In this embodiment of the present disclosure, since the target includes lead, zirconium, titanium and/or alloys thereof, the atoms or the ions 30 always includes lead ions, zirconium ions, or titanium ions. When the lead ions, zirconium ions, or titanium ions are form into a film on the upper surface of the piezoelectric layer 12, the lead ions, zirconium ions, or titanium ions have good adhesion and are easily coupled with the piezoelectric posts 122. Further, the atoms or the ions 30 are stacked in a regular manner so that the pinholes of the receiving electrodes 16 can be reduced, and the deposition effect can be improved, and the receiving electrode lines 162 have a more uniform thickness. Depositing the emitting electrodes 14 is similar to depositing the receiving electrodes 16, so that the process of depositing the emitting electrodes 14 can refer to the process of depositing the receiving electrodes 16.

Figure 12:
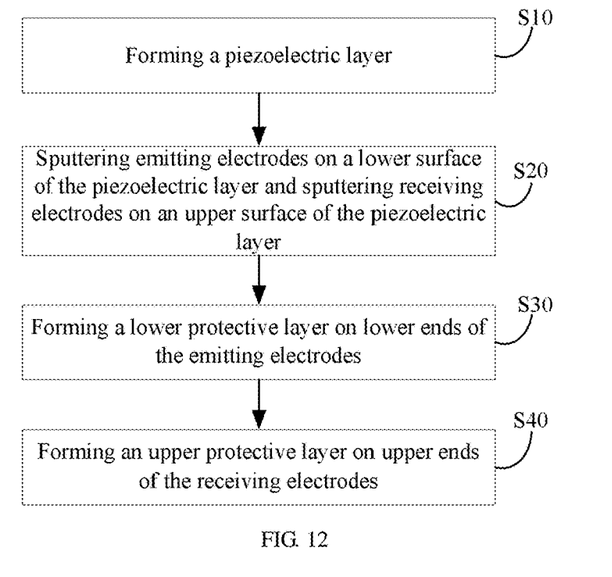
FIG. 12 is an alternative flow chart of a method for manufacturing an ultrasonic transducer, according to an embodiment of the present disclosure.

Referring to FIG. 12, in some embodiments, the method further includes the steps of:

S30: forming a lower protective layer on lower ends of the emitting electrodes 14; and S40: forming an upper protective layer on upper ends of the receiving electrodes 16.

Figure 13:
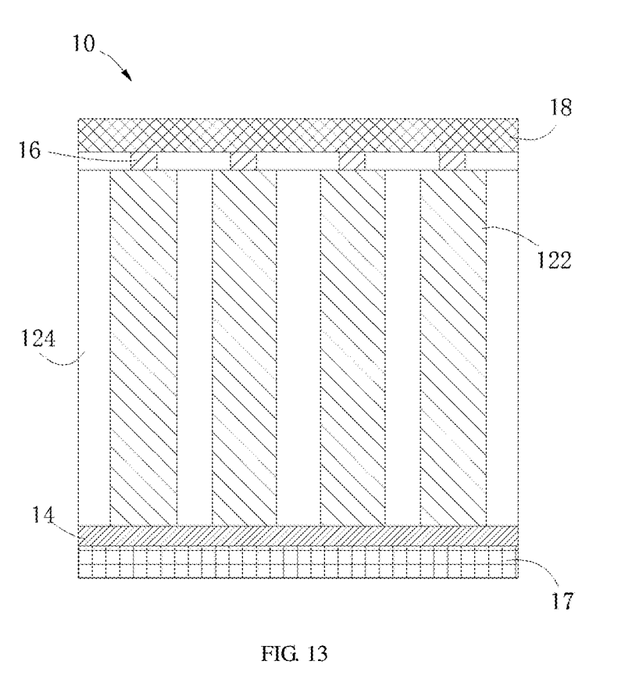
FIG. 13 is a planar view of an ultrasonic transducer, according to an embodiment of the present disclosure.

Referring to FIG. 13, in some embodiments, the ultrasonic transducer 10 includes a lower protective layer 17 and an upper protective layer 18. The lower protective layer 17 is arranged on lower ends of the emitting electrodes 14, and the upper protective layer 18 is arranged on the upper ends of the receiving electrodes 16.

Thus, the upper protective layer 18 and the lower protective layer 17 can prevent dust or moisture from entering the ultrasonic transducer 10. Further, the upper protective layer 18 and the lower protective layer 17 can make the structure of the ultrasonic transducer 10 more stable.

The execution order of the steps of S30 and S40 can be exchanged without any restriction. For example, the step of S30 can be implemented before the step of S20, and the step of S20 can be implemented before the step of S30.

In this present disclosure, unless indicated otherwise, a structure in which a first feature is "on" or "underneath" a second feature may include an embodiment in which the first feature directly contacts the second feature and may include an embodiment in which an additional feature is prepared between the first feature and the second feature so that the first feature does not directly contact the second feature. Furthermore, a structure in which a first feature is "on" or "above" a second feature may include an embodiment in which the first feature is right above or inclined above the second feature and may include an embodiment in which the first feature is higher than the second feature. A structure in which a first feature is "under" or "below" a second feature may include an embodiment in which the first feature is right under or inclined under the second feature and may include an embodiment in which the first feature is lower than the second feature.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An ultrasonic transducer comprising:
   a piezoelectric layer comprising:
      an array of piezoelectric posts configured for emitting and receiving ultrasonic wave, the material of each of the piezoelectric posts comprising lead zirconate titanate piezoelectric ceramics;
      a plurality of emitting electrodes formed on a lower surface of the piezoelectric layer by a sputtering process; and
      a plurality of receiving electrodes formed on an upper surface of the piezoelectric layer by the sputtering process; wherein each of the emitting electrodes and each of the receiving electrodes comprise lead, zirconium, titanium, and/or alloys thereof;
      wherein the piezoelectric posts are arranged in a matrix;
   a plurality of emitting electrode lines formed on the lower surface of the piezoelectric layer, each of the emitting electrode lines is connected to a row of the piezoelectric posts; and
   a plurality of receiving electrode lines formed on the upper surface of the piezoelectric layer, each of the receiving electrode lines is connected to a column of the piezoelectric posts.

2. The ultrasonic transducer of claim 1, wherein the emitting electrodes and the receiving electrodes are made of titanium-silicon alloy, titanium-zinc alloy, or titanium-nickel alloy.

3. The ultrasonic transducer of claim 1, wherein the ultrasonic transducer comprises:
   a lower protective layer arranged on lower ends of the emitting electrodes; and
   an upper protective layer arranged on the upper ends of the receiving electrodes.

4. The ultrasonic transducer of claim 1, wherein the piezoelectric layer further comprises a filling portion, and the filling portion is filled with gaps between the piezoelectric posts.

5. The ultrasonic transducer of claim 1, wherein the cross-section of each of the piezoelectric posts is substantially square.

6. The ultrasonic transducer of claim 1, the height of each of the piezoelectric posts is about 70-80 micrometers.

7. The ultrasonic transducer of claim 4, the filling portion is made of epoxy resin.

8. The ultrasonic transducer of claim 1, wherein the array of piezoelectric posts are formed by cutting groove grids on the piezoelectric material from a first direction and a second direction in a predetermined depth, and the first direction is perpendicular to the second direction.

9. The ultrasonic transducer of claim 1, wherein the array of piezoelectric posts are formed by etching a filling material at a predetermined position to form a plurality of columnar through holes, and then filling piezoelectric material in the columnar through holes.

10. A method for manufacturing an ultrasonic transducer, comprising:
    forming a piezoelectric layer, the piezoelectric layer comprising a plurality of piezoelectric posts, the material of each of the piezoelectric posts comprising lead zirconate titanate piezoelectric ceramics; and
    sputtering emitting electrodes on a lower surface of the piezoelectric layer and sputtering receiving electrodes on an upper surface of the piezoelectric layer, and each of the emitting electrodes and each of the receiving electrodes comprise lead, zirconium, titanium, and/or alloys thereof;
    wherein the step of forming a piezoelectric layer comprises:
       etching a filling material at a predetermined position to form a plurality of columnar through holes; and
       filling piezoelectric material in the columnar through holes.

11. The method of claim 10, wherein the step of sputtering process comprises:
    impinging a target with predetermined ions so that the component on a surface of the target is sputtered out of the target in the form of atoms or ions; and
    depositing the atoms or the ions on the lower surface and the upper surface of the piezoelectric layer to form the emitting electrodes and the receiving electrodes.

12. The method of claim 11, wherein the target comprises a lead target, a zirconium target, or a titanium target.

13. The method of claim 12, wherein the target comprises a titanium silicon target, a titanium zinc target, or a titanium nickel target.

14. The method of claim 12, wherein the method further comprises:
    forming a lower protective layer on lower ends of the emitting electrodes; and
    forming an upper protective layer on upper ends of the receiving electrodes.

15. An ultrasonic fingerprint recognition sensor, comprising:
    a substrate;
    a control chip positioned on and electrically connected to the substrate;
    an ultrasonic transducer positioned on and electrically connected to the control chip, the ultrasonic transducer comprising:
       a piezoelectric layer comprising:
          an array of piezoelectric posts configured for emitting and receiving ultrasonic wave, the material of each of the piezoelectric posts comprising lead zirconate titanate piezoelectric ceramics;
          a plurality of emitting electrodes formed on a lower surface of the piezoelectric layer by a sputtering process; and
          a plurality of receiving electrodes formed on an upper surface of the piezoelectric layer by the sputtering process; wherein each of the emitting electrodes and each of the receiving electrodes comprise lead, zirconium, titanium, and/or alloys thereof;

wherein the piezoelectric posts are arranged in a matrix;

a plurality of emitting electrode lines formed on the lower surface of the piezoelectric layer, each of the emitting electrode lines is connected to a row of the piezoelectric posts; and a plurality of receiving electrode lines formed on the upper surface of the piezoelectric layer, each of the receiving electrode lines is connected to a column of the piezoelectric posts; and a package packing the substrate, the control chip, and the ultrasonic transducer as a module.

16. An electronic device comprising:

a casing; and an ultrasonic fingerprint recognition sensor positioned in the casing for fingerprint recognition or authorization, the ultrasonic fingerprint recognition sensor, comprising:

a substrate;

a control chip positioned on and electrically connected to the substrate;

an ultrasonic transducer positioned on and electrically connected to the control chip, the ultrasonic transducer comprising:

a piezoelectric layer comprising:

an array of piezoelectric posts configured for emitting and receiving ultrasonic wave, the material of each of the piezoelectric posts comprising lead zirconate titanate piezoelectric ceramics;

a plurality of emitting electrodes formed on a lower surface of the piezoelectric layer by a sputtering process; and a plurality of receiving electrodes formed on an upper surface of the piezoelectric layer by the sputtering process; wherein each of the emitting electrodes and each of the receiving electrodes comprise lead, zirconium, titanium, and/or alloys thereof;

wherein the piezoelectric posts are arranged in a matrix;

a plurality of emitting electrode lines formed on the lower surface of the piezoelectric layer, each of the emitting electrode lines is connected to a row of the piezoelectric posts; and a plurality of receiving electrode lines formed on the upper surface of the piezoelectric layer, each of the receiving electrode lines is connected to a column of the piezoelectric posts; and a package packing the substrate, the control chip, and the ultrasonic transducer as a module.

* * * * *